US012562717B2

(12) United States Patent
Clara et al.

(10) Patent No.: US 12,562,717 B2
(45) Date of Patent: Feb. 24, 2026

(54) MULTI-GAIN-STEP DIGITAL STEP ATTENUATOR

(71) Applicant: Intel Corporation, Santa Clara, CA (US)

(72) Inventors: Martin Clara, Santa Clara, CA (US); Giacomo Cascio, Villach (AT); Erfan Ghaderi, Hillsboro, OR (US); Marc Jan Georges Tiebout, Finkenstein (AT)

(73) Assignee: Intel Corporation, Santa Clara, CA (US)

( * ) Notice: Subject to any disclaimer, the term of this patent is extended or adjusted under 35 U.S.C. 154(b) by 728 days.

(21) Appl. No.: 17/809,906

(22) Filed: Jun. 30, 2022

(65) Prior Publication Data

US 2024/0007083 A1      Jan. 4, 2024

(51) Int. Cl.
| | |
|---|---|
| *H03H 11/24* | (2006.01) |
| *H03H 7/25* | (2006.01) |
| *H04B 1/40* | (2015.01) |

(52) U.S. Cl.
CPC ............. *H03H 11/245* (2013.01); *H04B 1/40* (2013.01)

(58) Field of Classification Search
None
See application file for complete search history.

(56) References Cited

U.S. PATENT DOCUMENTS

| | | | | |
|---|---|---|---|---|
| 9,531,359 | B1 * | 12/2016 | Shrivastava | ......... H03H 11/245 |
| 10,193,520 | B2 * | 1/2019 | Bergsma | ................... H03H 7/25 |
| 10,396,735 | B2 * | 8/2019 | Bergsma | ................... H03H 7/25 |
| 11,329,689 | B1 * | 5/2022 | Rodenbeck | ............ H04B 1/525 |
| 2017/0033770 | A1 * | 2/2017 | Jordan | ................. H03H 11/245 |
| 2017/0250723 | A1 * | 8/2017 | Srirattana | ............ H03H 11/245 |

FOREIGN PATENT DOCUMENTS

| | | | | |
|---|---|---|---|---|
| CN | 111464145 | A * | 7/2020 | ............... H03H 7/25 |
| JP | 2014082755 | A * | 5/2014 | ............... H03H 7/25 |
| WO | WO-2013178271 | A1 * | 12/2013 | ............... H03K 5/08 |
| WO | WO-2013181445 | A1 * | 12/2013 | ............... H03H 7/25 |
| WO | WO-2023168155 | A1 * | 9/2023 | ............... H03H 7/25 |

OTHER PUBLICATIONS

Takahashi Hisao (Hisao English Translation), Variable voltage driving circuit, JP 09016276, (Year: 1997).*

* cited by examiner

*Primary Examiner* — Mohammed Rachedine
(74) *Attorney, Agent, or Firm* — 2SPL Patent Attorneys PartG mbB; Yong Beom Hwang

(57) ABSTRACT

A digital step attenuator for automatic gain control in a transceiver front-end. The digital step attenuator includes a series path coupled between an input port and an output port, a plurality of series shunt switches coupled in parallel to the series path, and a plurality of parallel paths coupled to the series path in parallel. The series path includes a plurality of series resistors coupled in series. Each series shunt switch is for by-passing a different set of one or more series resistors. Each parallel path includes a parallel resistor and a parallel shunt switch, and each parallel path is coupled to either the input port, the output port, or an internal node between two adjacent series resistors, in parallel. A plurality of different π-attenuators with a different topology are formed by selectively controlling the series shunt switches and the parallel shunt switches.

13 Claims, 13 Drawing Sheets

Attenuation step 0

No Attenuation or Bypass Mode $|\alpha_0|$

Attenuation Step 1 $|\alpha_1|$

Attenuation Step 2 $|\alpha_2|$

Attenuation Step 3 $|\alpha_1 \cdot \alpha_2|$

MULTI-GAIN-STEP DIGITAL STEP ATTENUATOR

BACKGROUND

A digital step attenuator (DSA) is a device used for automatic gain control in a transmitter (TX) or receiver (RX) front-end, e.g., in direct-sampling multi-GHz applications. A DSA, unlike variable attenuators, may switch in discrete and finite attenuation states.

Integrated radio frequency (RF) transceivers may include an analog DSA with a wide gain range and fine gain steps. A receiver (RX) front-end may include I/Q and direct RF-sampling analog-to-digital converters (ADCs) and a transmitter (TX) front-end may include I/Q and direct RF-sampling digital-to-analog converters (DACs). The design of the RF front-end needs to ensure some key parameters such as, maximization of input bandwidth, reduction of insertion loss, improving overall noise figure and RF chain linearity.

Attenuators are preferred to variable gain amplifiers (VGAs) due to their almost zero DC power consumption. Low device power consumption is an important requirement since, typically, the system includes a large number of individual transmit/receive modules integrated with the respective antenna elements, including the automatic gain control of transmitter-receiver systems.

Complementary metal-oxide-silicon (CMOS) gain controlling circuits are desired to be integrated together with all the RF blocks into a single transceiver chip. Power handling capability and performance insensitivity over temperature and technology process variations are also required. Given the requirements, a DSA is preferable to a variable gain amplifier or an analog attenuator in terms of control complexity, power consumption, phase variation, and linearity. Implementation of a wideband passive attenuation stage with many gain steps in bulk CMOS technology is mainly limited by the ratio of the on-resistance (Ron) and the off-state parasitic capacitances of the Field Effect Transistor (FET) switches (Ron/Coff), which can significantly compromise the equivalent input bandwidth of the analog front-end.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e., only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
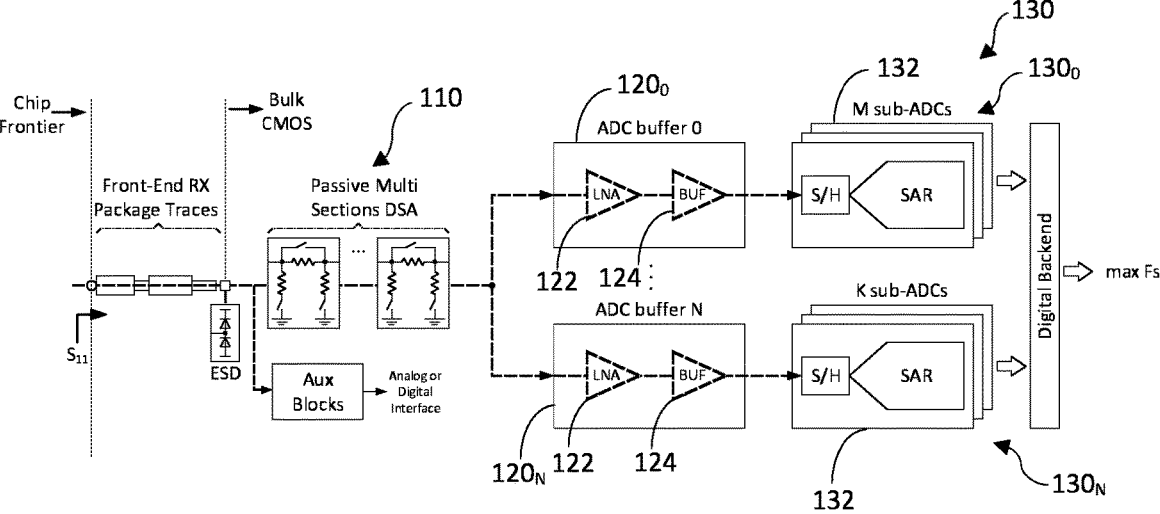
FIG. 1 shows an example of an RX front-end and a direct RF-sampling ADC.

FIG. 1 shows an example of an RX front-end and a direct RF-sampling ADC. The direct RF-sampling ADC 130 may include a plurality of time-interleaved (TI) sub-ADCs 132. Each sub-ADC 132 may include capacitor-based sample-and-hold circuitry (S/H). The sub-ADCs 132 may be split into multiple sub-ADC banks $130_0$, . . . , $130_N$. Each sub-ADC bank $130_0$, . . . , $130_N$ is preceded by an RF amplification stage(s) $120_0$, . . . , $120_N$ (e.g., a low noise amplifier (LNA) 122 and a buffer 124) or a buffering stage (without amplification) used just for signal regeneration and/or to increase the isolation (e.g., from external circuitries on PCB). Each RF amplification stage $120_0$, . . . , $120_N$ drives a separate sub-ADC bank $130_0$, . . . , $130_N$. Each RF amplification stage $120_0$, . . . , $120_N$ receives an RF input signal (shared) from a digital step attenuator (DSA) 110, which may be the first input block in the RF chain. The DSA

110 controls and adapts digitally the strength of the RF input signal to better fit the ADC's full-scale to maximize a signal-to-noise ratio (SNR) and avoid saturation of the ADC 130.

Figure 2A:
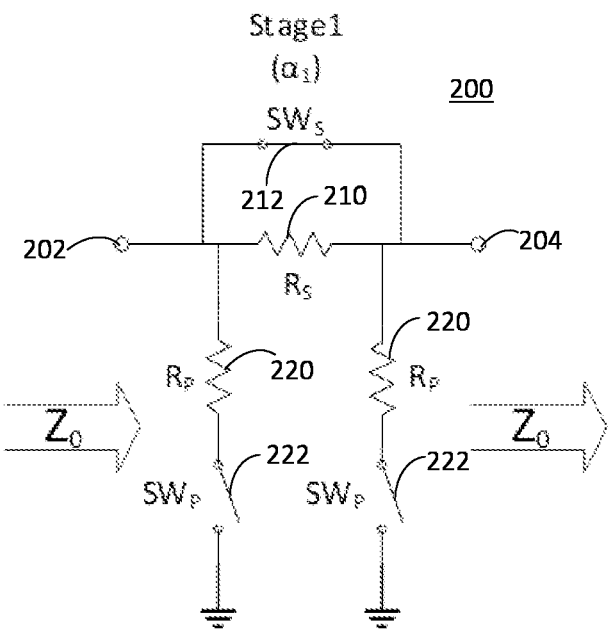
FIGS. 2A and 2B show conventional DSAs.
Figure 2B:
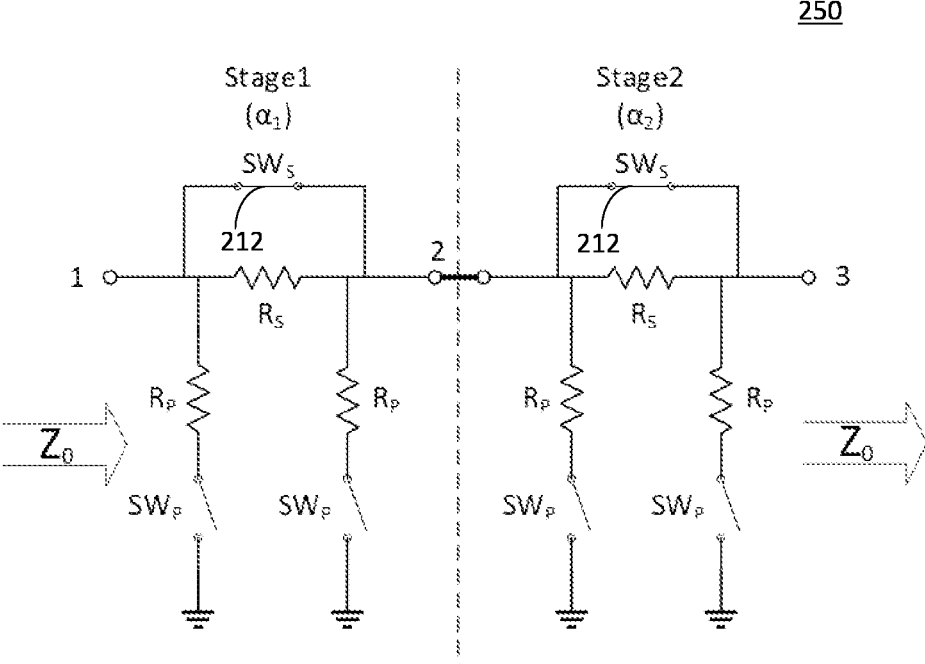

FIGS. 2A and 2B show conventional DSAs (i.e., a switched π-attenuator). FIGS. 2A and 2B show a single-ended π topology (configuration) referenced to ground. FIG. 2A shows a single gain-step π-attenuator 200 (also referred to as π-pad). The π-attenuator 200 includes one series resistor 210 and two parallel resistors 220. A series shunt switch (SW$_s$) 212 is coupled in parallel to the series resistor 210 between the input and output ports 202, 204 of the attenuator 200 for by-passing the series resistor 210. Each parallel shunt resistor 220 is coupled with a parallel shunt switch (SW$_p$) 222 in series to ground at the input and output ports 202, 204 of the π-attenuator 200. The resistive elements 212, 222 are chosen for the desired attenuation loss of the π-attenuator 200.

FIG. 2B shows a multi-gain-step π-attenuator 250. The multi-gain-step attenuator 250 includes a cascaded array of multiple π-attenuators 200 (two π-attenuators in FIG. 2B). The number of attenuation sections in a multi-gain-step attenuator 250 is a function of the covered gain range (typically wide) over the gain step/resolution (typically small). This makes the implementation of the multi-gain-step π-attenuator difficult since the number of series switches (SW$_s$) 212 increases significantly as the number of cascaded attenuation sections increases, which degrades the bandwidth, the insertion loss, the noise figure, and in general all key parameters of the analog RF front-end.

Direct RF-sampling ADCs require a wideband analog front-end. Therefore, it is needed to reduce the number of attenuation sections to the minimum, while keeping the same resolution (a minimum gain-step) and attenuation range.

Examples of a multi-gain-step passive DSA will be explained hereafter. In examples, two or more passive DSA sections are combined into a single attenuator (or attenuation section). This allows reductions of the number of series shunt switches (SWs) and as a consequence, a lower insertion-loss, a better noise figure, linearity, and enhanced bandwidth.

In examples, a DSA (or a DSA section) includes a series path coupled between an input port and an output port, a plurality of series shunt switches coupled in parallel to the series path, and a plurality of parallel paths coupled to the series path in parallel. The series path includes a plurality of series resistors coupled in series. Each series shunt switch is for by-passing a different set of one or more series resistors. One of the series shunt switches is coupled between the input port and the output port to by-pass all series resistors and thereby provide a zero-attenuation state (a reference attenuation state/by-pass mode). Each parallel path includes a parallel resistor and a parallel shunt switch, and each parallel path is coupled to either the input port, the output port, or an internal node between two adjacent series resistors, in parallel. At least two parallel paths may be coupled to the input port and the output port, respectively, and at least one parallel path is coupled to each internal node between two adjacent series resistors. A plurality of different π-attenuators with a different topology may be formed by selectively controlling the series shunt switches and the parallel shunt switches. The series and parallel resistors are selected for the desired attenuation losses of the multiple attenuation steps. The plurality of different π-attenuators with a different topology can provide different (discrete) levels of attenuation, (e.g., in linear or binary steps, or the like). Alternatively, the attenuation states of the DSA may vary continuously by controlling the ON-resistance of the switches.

The digital step attenuator has a nested structure such that different single π-attenuators and a cascaded π-attenuator cascading two π-attenuators can be formed by selectively switching on and off the series shunt switches and the parallel shunt switches. A different combination of parallel paths and the series path is selected by controlling the series shunt switches and the parallel shunt switches to form a different single π-attenuator or a cascaded π-attenuator. Multiple different single π-attenuators with a different attenuation factor may be formed by selectively controlling the series shunt switches and the parallel shunt switches. A cascaded π-attenuator cascading two π-attenuators may also be formed by selectively controlling the series shunt switches and the parallel shunt switches. Each DSA section may be matched at input and output ports to the reference impedance (tailored to the specific application) so that cascading different sections still guarantees input/output impedance matching.

The series shunt switches and the parallel shunt switches are preferably field effect transistor (FET) switches preferably of the same device type (e.g., voltage class, geometry, etc.) to have good tracking. In some examples, the digital step attenuator may include an ON-resistance compensation loop configured to compensate a variation of an ON-resistance of the series shunt switches and the parallel shunt switches. The ON-resistance of the switches may vary due to temperature and process variations or aging, etc. The ON-resistance compensation loop tracks the switch ON-resistance variation due to temperature change, processing variation, aging, or the like and regulate the ON-resistance of the switches in the DSA to a desired value. The DSA (either a single-stage DSA or a cascaded DSA including multiple such single-stage DSAs) may be used in a transceiver front-end, such as the one shown in FIG. 1.

Figure 3:
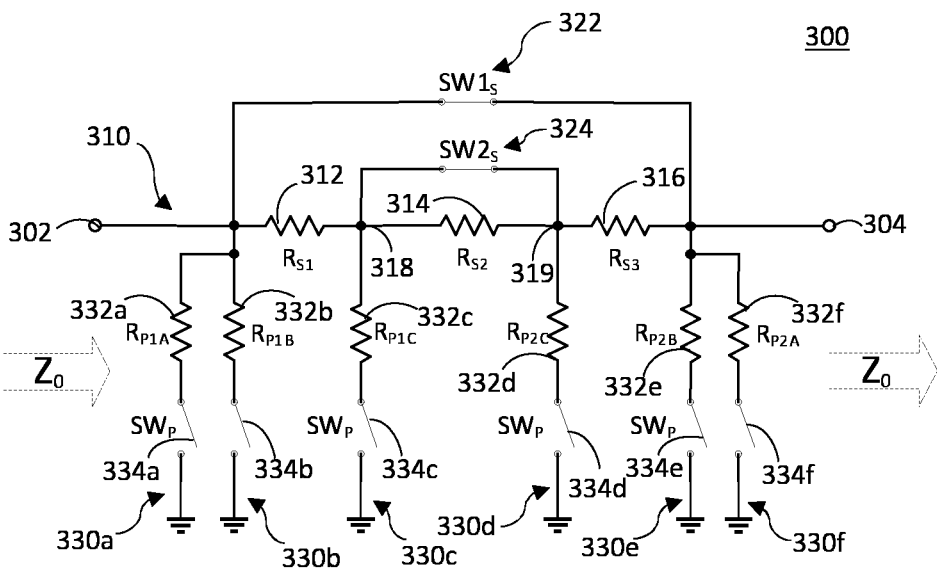
FIG. 3 shows an example multi-gain-step passive DSA (or DSA section) in accordance with one example.

FIG. 3 shows an example multi-gain-step passive DSA (or DSA section) in accordance with one example. The example multi-gain-step DSA 300 in FIG. 3 combines two DSA sections into a single DSA (or DSA section). The multi-gain-step DSA 300 has a nested structure for combining two DSA sections into a single π-attenuation section. It should be noted that the structure of the multi-gain-step DSA in FIG. 3 can be extended to combine more than two DSA sections into a single DSA section.

The multi-gain-step DSA 300 includes a series path 310, a plurality of series shunt switches 322, 324, and a plurality of parallel paths 330a-330f. The series path 310 is coupled between an input port 302 and an output port 304 of the DSA 300 and includes a plurality of series resistors (three series resistors 312, 314, 316 in this example) coupled in series.

The plurality of series shunt switches 322, 324 are coupled in parallel to the series path 310. Each of the plurality of series shunt switches 322, 324 is for by-passing a different set of one or more series resistors 312, 314, 316. One of the plurality of series shunt switches (switch 322) is for by-passing all series resistors 312, 314, 316 for zero attenuation (reference attenuation). The series shunt switch 324 is for by-passing the series resistor 314. The series shunt switches 322 and 324 are selectively switched on and off for a different attenuation factor.

The plurality of parallel paths 330a-330f are coupled to the series path 310 in parallel. Each of the plurality of parallel paths 330a-330f includes a parallel resistor 332a-332f and a parallel switch 334a-334f that are coupled in series, respectively. Each of the plurality of parallel paths 330a-330f is coupled to either the input port 302, the output port 304, or an internal node between two adjacent series resistors (either a node 318 between series resistors 312 and 314 or a node 319 between series resistors 314 and 316) in parallel. In the example in FIG. 3, the parallel paths 330a and 330b are coupled to the input port 302 in parallel, the parallel path 330c is coupled to the node 318 between series resistors 312 and 314 in parallel, the parallel path 330d is coupled to the node 319 between series resistors 314 and 316 in parallel, and the parallel paths 330e and 330f are coupled to the output port 304 in parallel.

A plurality of different π-attenuators with a different topology are formed by selectively controlling the series shunt switches 322, 324 and the parallel shunt switches 334a-334f as shown in FIGS. 4A-4D. The desired attenuation of the DSA 300 may be obtained by switching between a reference state (no attenuation) and an attenuation state. The DSA section 300 has two operating modes, namely, a through mode (without attenuation) and an attenuation mode (variable a depending on the specific section).

Figure 4A:
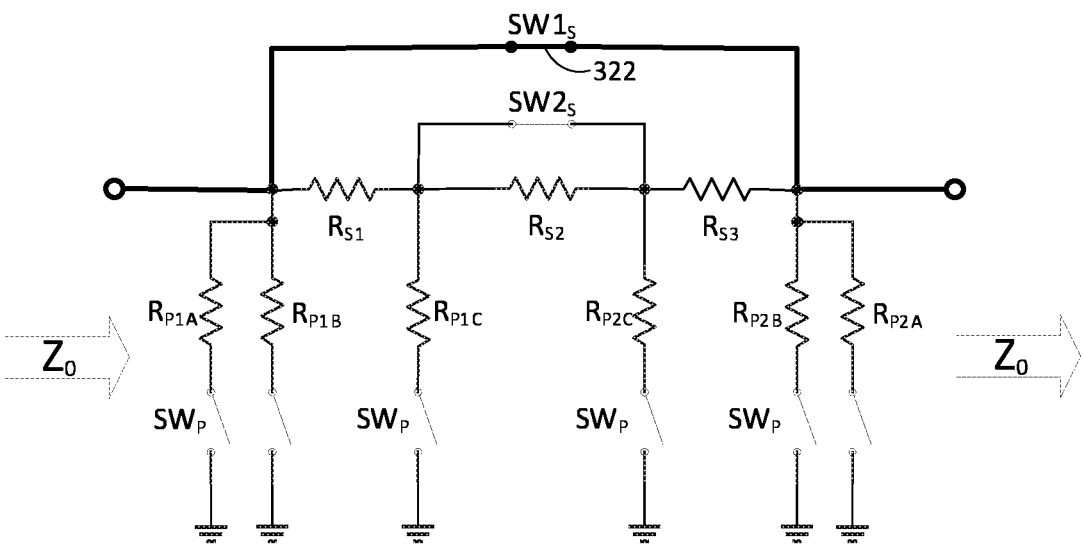
FIGS. 4A-4D show the multi-gain-step passive DSA in four different attenuation states.
Figure 4B:
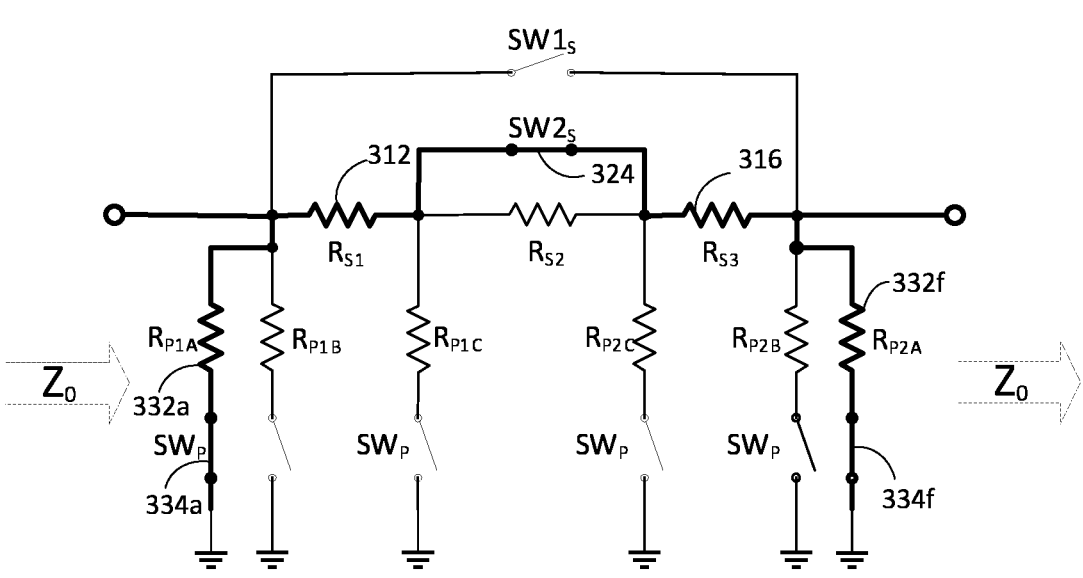
Figure 4C:
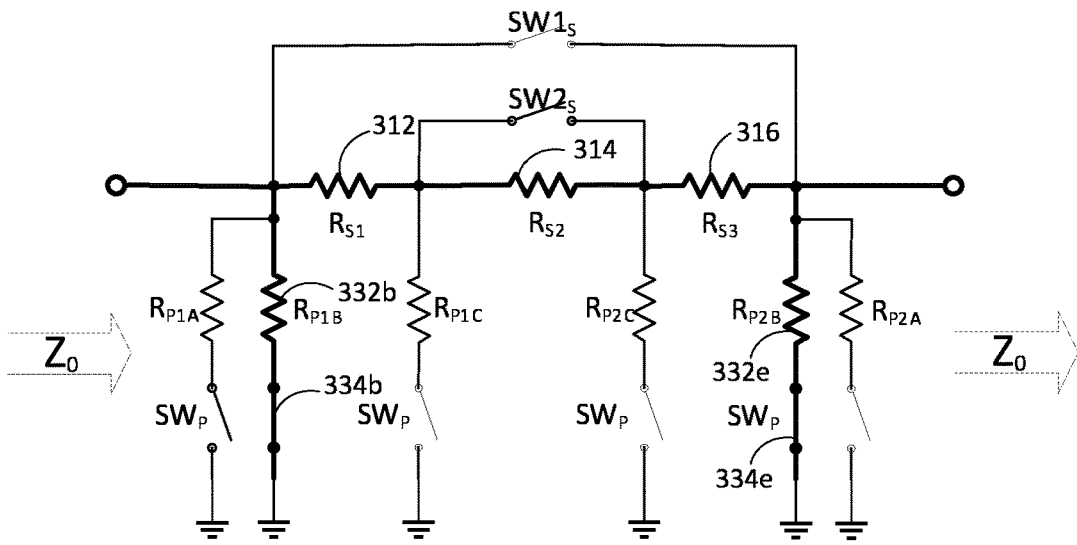

By integrating two DSA sections into a single DSA section, the multi-gain-step DSA 300 of FIG. 3 can be configured for four different attenuation steps (attenuation steps 0-3). The first attenuation step of α0 (no attenuation) is shown in FIG. 4A. The second and third attenuation steps of α1 and α2 (|α2|>|α1|) are shown in FIGS. 4B and 4C, respectively. The fourth attenuation step of α3 is shown in FIG. 4D.

FIG. 4A shows the multi-gain-step passive DSA 300 in a by-pass mode (i.e., without attenuation). In a by-pass mode (no attenuation (α0), a reference state), the input port 302 and the output port 304 are connected via a single switch (i.e., the switch 322). By activating the switch 322, all series resistors 312, 314, 316 are by-passed. This ensures a minimum insertion loss (a lower noise figure) and better bandwidth compared to the cascaded DSA sections in FIG. 2B. The switch 322 may be a transmission gate.

The second and third attenuation steps of α1 and α2 (|α2|>|α1|) are implemented with two reconfigurable π topologies as shown in FIGS. 4B and 4C, respectively. FIG. 4B shows a multi-gain-step passive DSA 300 with attenuation α1. In FIG. 4B, the parallel shunt switches 334a and 334f and the series shunt switch 324 are switched on to form a single π-attenuator with the parallel resistors 332a and 332f and series resistors 312 and 316. FIG. 4C shows a multi-gain-step passive DSA 300 with attenuation α2. In FIG. 4C, the parallel shunt switches 334b and 334e are switched on to form a single π-attenuator with the parallel resistors 332b and 332e and series resistors 312, 314, and 316.

Figure 4D:
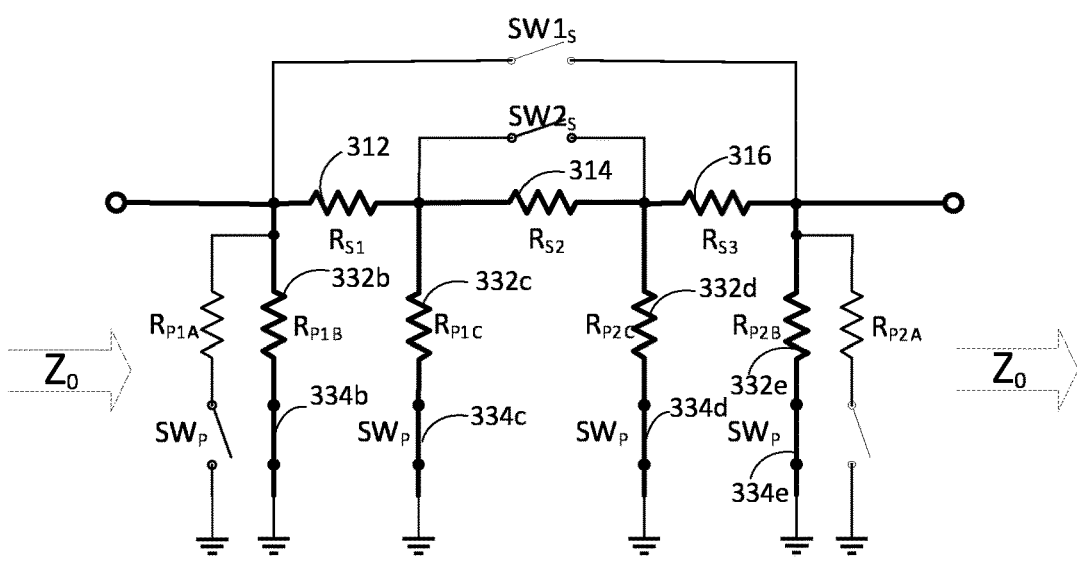

FIG. 4D shows a multi-gain-step passive DSA 300 with attenuation α3=|α2·α1|. The attenuation step (|α2·α1|) is implemented with two inner parallel shunt resistors (nested PI section). In FIG. 4D, the parallel shunt switches 334b, 334c, 334d, and 334e are switched on to form the cascaded two π-attenuators with the four parallel resistors 332b, 332c, 332d, and 332e and series resistors 312, 314, and 316. Two π-attenuation sections are implemented by activating additional internal parallel resistors 332c and 332d.

Figure 5:
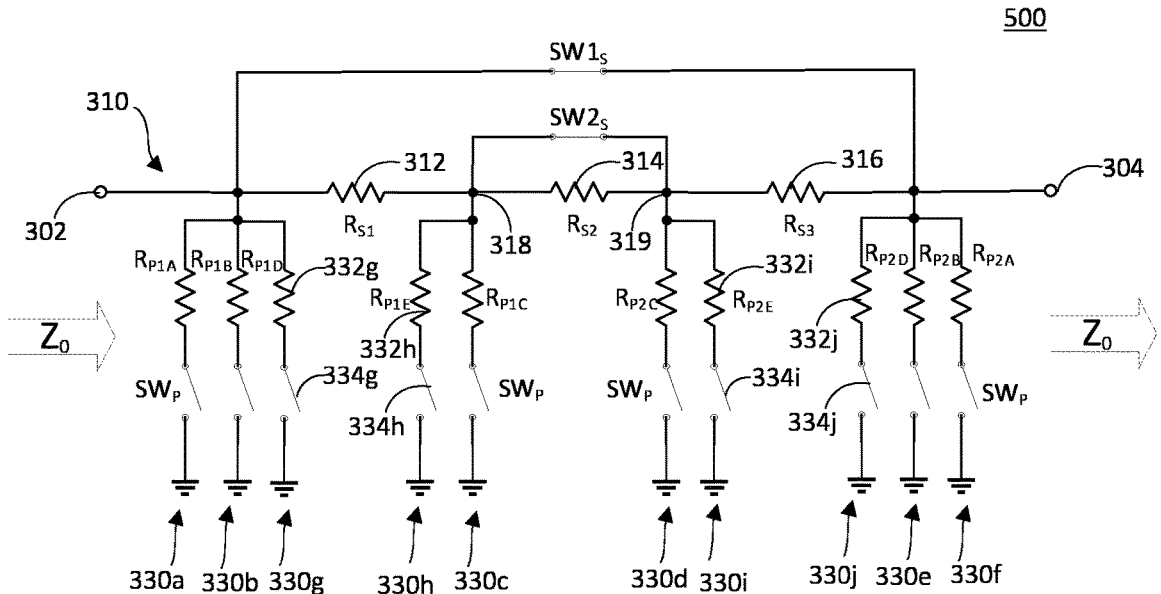
FIG. 5 shows an example multi-gain-step passive DSA in accordance with another example.

As stated above, more than two DSA sections (e.g., 3, 4, 5, or more DSA sections) may be combined into a single multi-gain-step DSA section. FIG. 5 shows an example multi-gain-step passive DSA (section) in accordance with another example. The example multi-gain-step DSA 500 in FIG. 5 combines three DSA sections into a single DSA section. The multi-gain-step DSA 500 has a nested structure for combining three DSA sections into a single π-attenuation section.

The structure of the multi-gain-step DSA 500 in FIG. 5 is same as the structure of the multi-gain-step DSA 300 in FIG. 3 except that additional parallel paths 330g-330j are further coupled to the series path 310 in parallel. Each parallel path 330g-330j includes a parallel resistor 332g-332j and a parallel shunt switch 334g-334j. The additional parallel paths 330g-330j are added to obtain the intermediate gain states between the gain states (attenuation states 0-4 in FIGS. 4A-4D) of the multi-gain-step DSA 300. The parallel path 330g is coupled to the input port 302, the parallel path 330h is coupled to the node 318 between the resistors 312 and 314, the parallel path 330i is coupled to the node 319 between the resistors 314 and 316, and the parallel path 330j is coupled to the output port 304. By integrating three DSA sections into a single DSA section, the multi-gain-step DSA 500 of FIG. 5 can be configured for eight different attenuation steps (state 0 to state 7). FIGS. 6A-6H show the eight states of the multi-gain-step passive DSA 500.

Figure 6A:
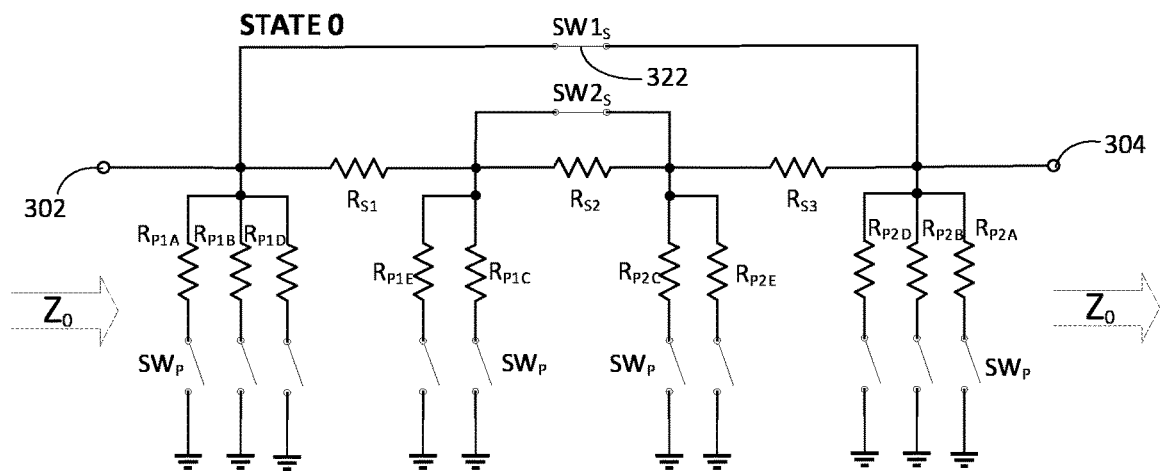
FIGS. 6A-6H show the eight states of the multi-gain-step passive DSA.

FIG. 6A shows state 0 (no attenuation) of the multi-gain-step passive DSA 500. State 0 is a by-pass mode (i.e., without attenuation). In a by-pass mode (no attenuation (α0), which may be a reference state), the input port 302 and the output port 304 are connected via a single switch (i.e., the switch 322).

Figure 6B:
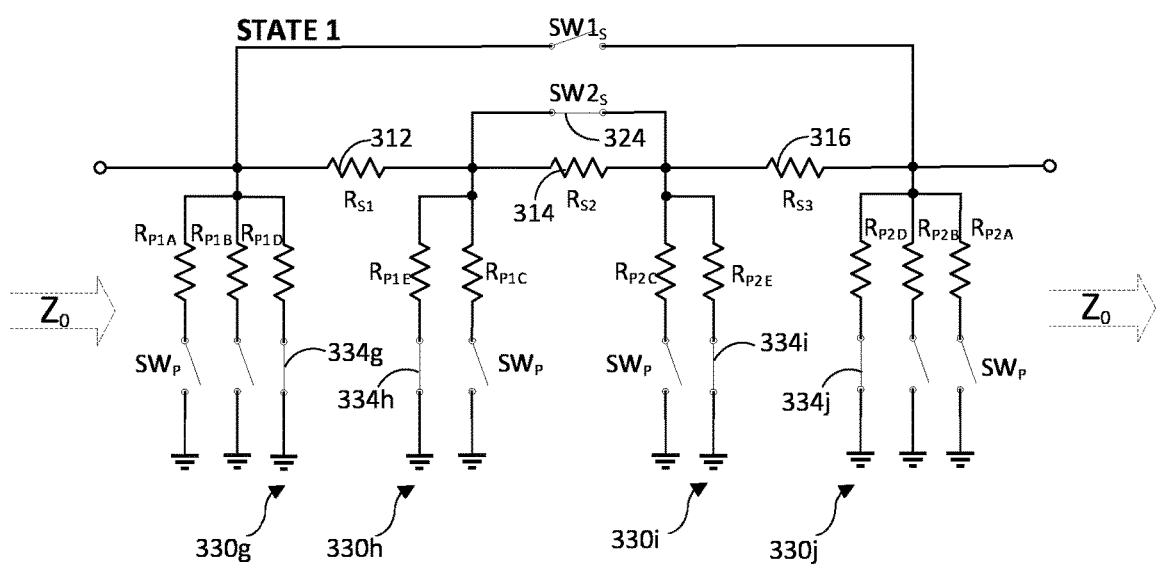

FIG. 6B shows state 1 of the multi-gain-step passive DSA 500. State 1 is the intermediate gain step between the attenuation step 0 (by-pass mode) and the attenuation step 1 in FIGS. 4A and 4B. In state 1, the four parallel shunt switches 334g-334j in the additional parallel paths 330g-330j and the series shunt switch 324 are switched on to form the cascaded two π-attenuators with the four additional parallel paths 330g-330j and the series resistors 312 and 316.

Figure 6C:
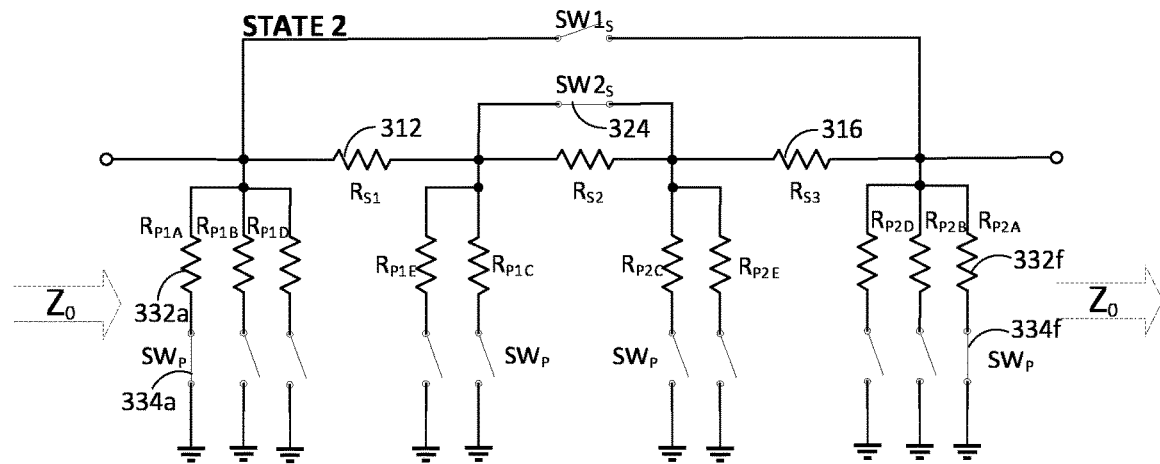

FIG. 6C shows state 2 of the multi-gain-step passive DSA 500. State 2 in FIG. 6C is basically the same as the attenuation step 1 in FIG. 4B. In state 2, the parallel shunt switches 334a and 334f and the series shunt switch 324 are switched on to form a single π-attenuator with the parallel resistors 332a and 332f and series resistors 312 and 316.

Figure 6D:
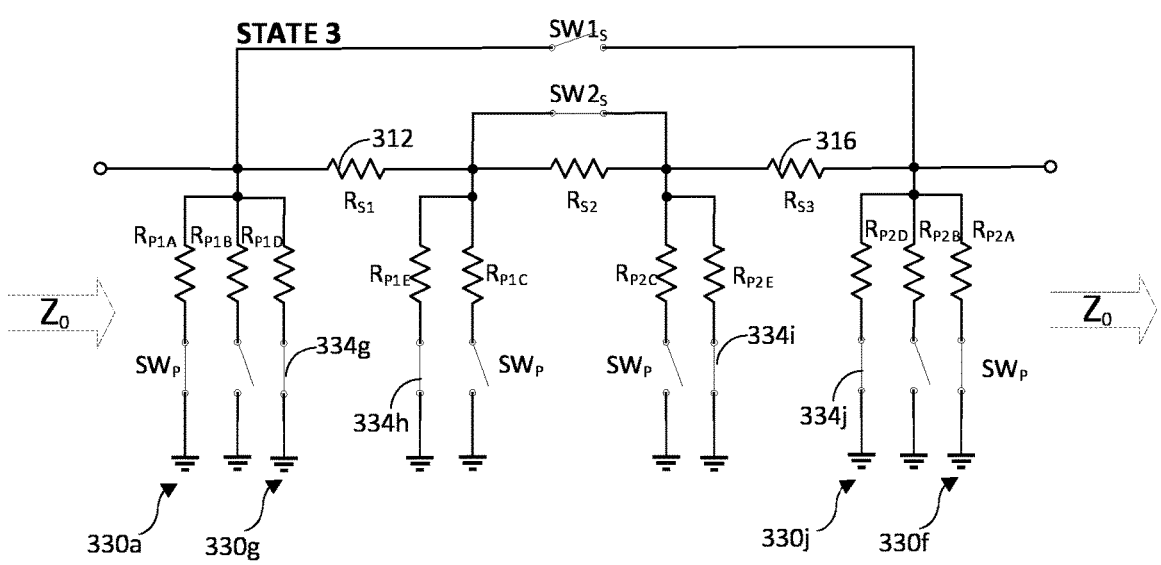

FIG. 6D shows state 3 of the multi-gain-step passive DSA 500. State 3 is the intermediate gain between attenuation step 1 and attenuation step 2 in FIGS. 4B and 4C. In state 3, the four parallel shunt switches 334g-334j are further switched on from state 2 to form a single π-attenuator with the parallel paths 330a, 330f, 330g, and 330j and series resistors 312 and 316.

Figure 6E:
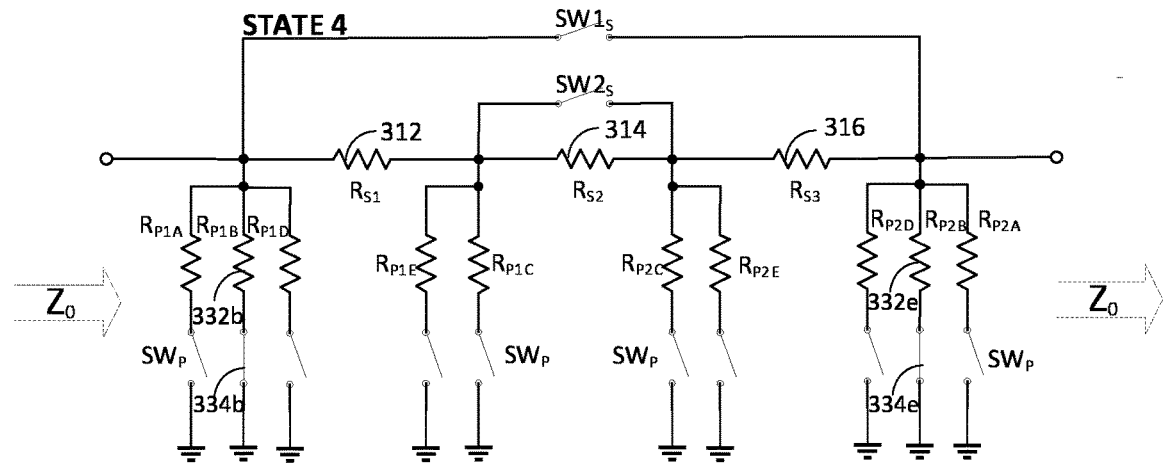

FIG. 6E shows state 4 of the multi-gain-step passive DSA 500. The state 4 in FIG. 6E is basically the same as the attenuation step 2 in FIG. 4C. In FIG. 6E, the parallel shunt switches 334b and 334e are switched on to form a single π-attenuator with the parallel resistors 332b and 332e and series resistors 312, 314, and 316.

Figure 6F:
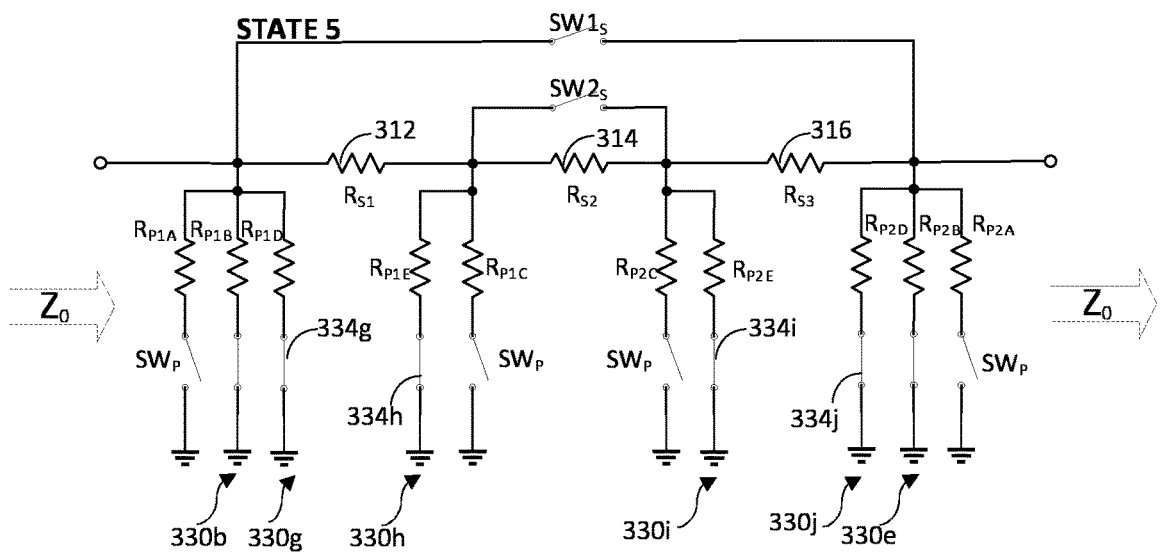

FIG. 6F shows state 5 of the multi-gain-step passive DSA 500. State 5 is the intermediate gain step between attenuation step 2 and attenuation step 3 in FIGS. 4C and 4D. In state 5, the four parallel shunt switches 334g-334j are further switched on from state 4 to form the cascaded two π-attenuators with the parallel paths 330b, 330g, 330h, 330e, 330i, and 330j and series resistors 312, 314, and 316.

Figure 6G:
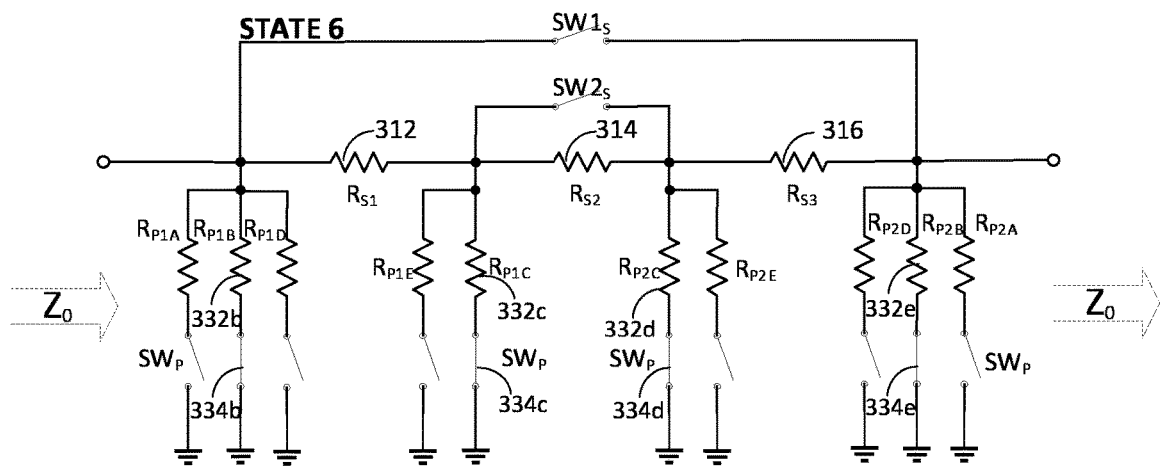

FIG. 6G shows state 6 of the multi-gain-step passive DSA 500. The state 6 in FIG. 6G is basically the same as the attenuation step 3 in FIG. 4D. The state 6 is implemented with two inner parallel shunt resistors (nested PI section). In FIG. 6G, the parallel shunt switches 334b, 334c, 334d, and 334e are switched on to form the cascaded two π-attenuators with the four parallel resistors 332b, 332c, 332d, and 332e and series resistors 312, 314, and 316. Two π-attenuation sections are implemented by activating additional internal parallel resistors 332c and 332d.

Figure 6H:
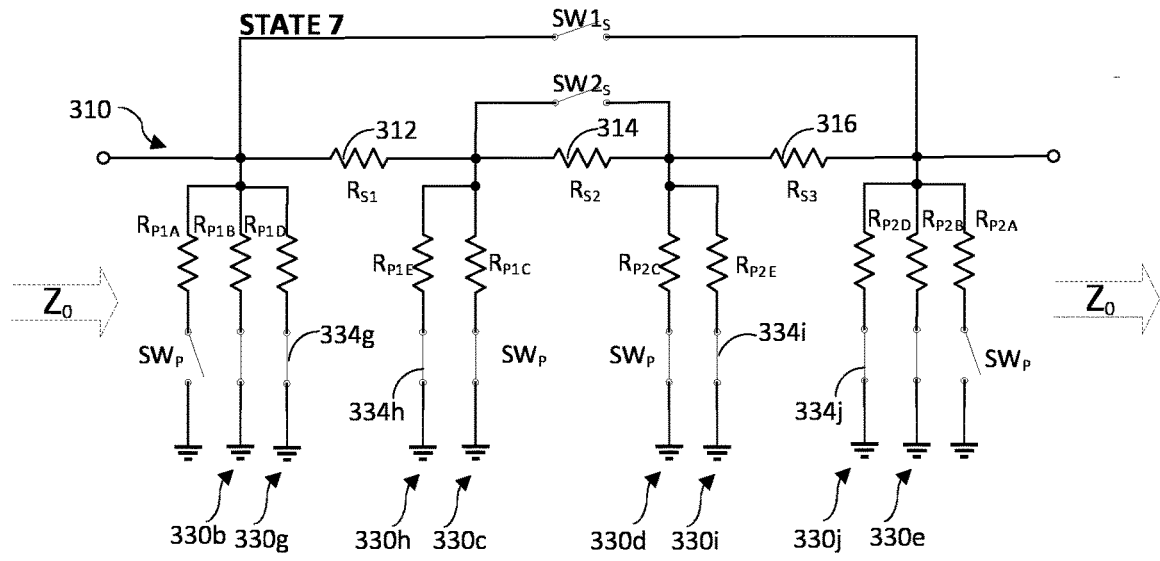

FIG. 6H shows state 7 of the multi-gain-step passive DSA 500. State 7 is the next intermediate gain step after attenuation step 3 in FIG. 4D (i.e., the next intermediate step after state 6 in FIG. 6G). In state 7, the four parallel shunt switches 334g-334j are further switched on from state 6 to form the cascaded two π-attenuators with the parallel paths 330b-e and 330g-j and series resistors 312, 314, and 316.

The resistive elements 312-316 and 332a-332j are chosen for the desired attenuation of the attenuation states of the π-attenuator 500. The attenuation in the attenuation states may vary, for example linearly, in binary steps, or the like, or may be continuous.

The multi-gain-step DSA 300, 500 may be cascaded in series for a desired attenuation range or steps. Resistors and switches (e.g., a transmission gate) of the multi-gain-step DSAs may be designed to provide input/output matching to a pre-defined reference impedance Z0. Therefore, the multi-gain-step passive DSA 300, 500 may be cascaded without compromising the overall return loss ($S_{11}$<target value).

In accordance with examples disclosed herein, multiple DSA sections are combined into a single DSA section. Merging two or more cascaded stages into a single attenuation section offers the following advantages. It reduces the insertion-loss because there is only one shunt switch in series by having a single series shunt switch by-passing the DSA section in a reference mode (i.e., no attenuation). It also improves an overall noise-figure. The compact layout allows to keep better control of the parasitic capacitance and enhances the input equivalent bandwidth. Different attenuation/gain settings are achieved with two external re-configurable PI sections, plus an inner one (nested) to provide the combined attenuation ($|\alpha1 \cdot \alpha2|$). It also optimizes the silicon area and therefore, reduces a production cost. The DSAs in accordance with the examples are easily implementable in bulk CMOS technology.

It should be noted that the figures show only the single-ended structure of the DSAs (i.e., reference to ground or any DC voltage). However, the examples are applicable to the balanced DSA structure as well. In this case, the DSA includes two series paths including the series shunt switches and a plurality of parallel paths that are coupled between the two series paths.

The physical resistors in the DSAs in FIGS. 3 through 6H may be gate-poly type resistors (in CMOS technologies), high-resistive metal-gate material (in FinFET technologies), metal sheet resistors, or the like. The metal sheet resistors can be distinguished from plain metal wiring by their regular layout structure (intended resistor, instead of parasitic wiring resistance), and, possibly, a minimum resistance value per unit. The actual unit resistor value depends on the number of sections and the characteristic impedance (usually 100 Ohm for a standard balanced RF-input).

The examples disclosed herein can be generalized to a number (M) of attenuation stages merged into a single DSA section by adding more series/parallel resistors and switches. In the case of binary weighted attenuation steps, if M is the number of merged sections, the required number of states per section follows the rule: $N_{ST}=2^M$. For example, if M=2 (i.e., two sections are merged), then $N_{ST}=4$ attenuation states, and if M=3 (i.e., three sections are merged), then $N_{ST}=8$ attenuation states, and so on.

One key parameter for a DSA block is its performance insensitivity over temperature changes, processing variations, aging, etc. To achieve this goal, a compensation and tracking loop may be used. The switches 322, 324 and 332a-332j in the DSA sections 300, 500 are preferably FET switches. The resistance value between the drain and source of an FET switch during operation (ON) is called the ON-resistance ($R_{ON}$). The ON-resistance of the switches (FET switches) can vary over time due to temperature or processing variation, aging, or the like.

Figure 7:
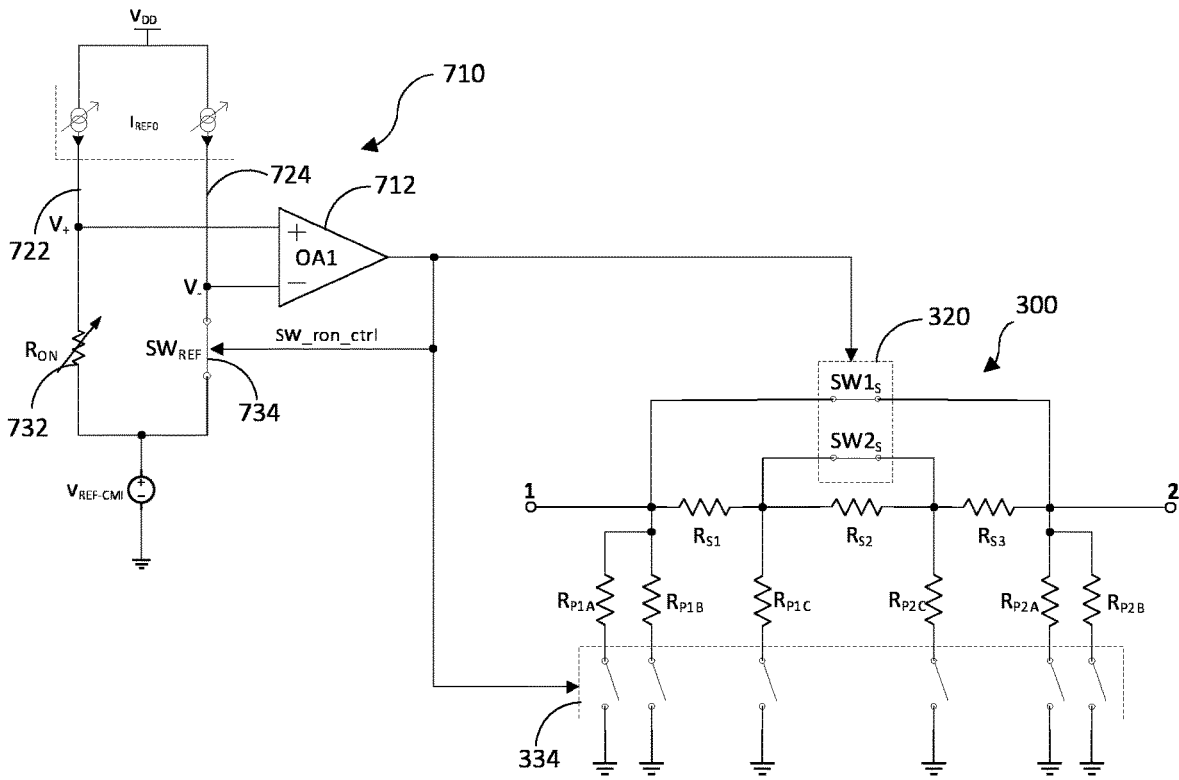
FIG. 7 shows an example multi-gain-step passive DSA with an FET switch ON-resistance ($R_{ON}$) compensation loop.

FIG. 7 shows an example multi-gain-step passive DSA with an FET switch ON-resistance ($R_{ON}$) compensation loop. An ON-resistance compensation loop 710 is provided for tracking the switch ON-resistance variation due to temperature change, process variation, aging, or the like and regulate the ON-resistance of the switches (i.e., FET switches, SWs and SWp) in a DSA section to a desired and programmable value. This is particularly needed for high-performance RF circuits. The DSA 300 of FIG. 3 is shown in FIG. 7. However, the ON-resistance compensation loop may be used with the DSA 500 of FIG. 5 or any other DSAs.

The ON-resistance compensation loop 710 includes an operational amplifier 712. The differential inputs of the operational amplifier 712 are coupled to two signal paths 722, 724 that are coupled in parallel and include a current source. One path 722 includes a (variable) reference resistor 732, and the other path 724 includes a reference switch 734 (SW$_{REF}$). The resistance of the (variable) reference resistor 732 is set to a target value. The reference resistor 732 may be built using a copy or copies of the physical resistor unit in the DSA 300 (e.g., $R_{S1}$ or $R_{P14}$, etc.). The ON-resistance compensation loop 710 regulates the ON-resistance of the reference switch 734 to match its ON-resistance to the reference resistor 732. The reference resistor 732 may be made variable to cover different ratios of the physical resistance of the resistor 732 to the ON-resistance of the reference switch 734. The primary function of the loop 710 is to match the ON-resistance of the reference switch 734 to the resistor 732. R(resistor 732)×IREF(resistor 732)=$R_{ON}$ (switch 734)×IREF(switch 734), with IREF(resistor 732) and IREF(switch 734) being the respective DC-currents forced into the reference resistor 732 and the reference switch 734. The voltage sensed on the path 722 is coupled to the non-inverting input terminal of the operational amplifier 712 and the voltage sensed on the other path 724 is coupled to the inverting input terminal of the operational amplifier 712. The output of the operational amplifier 712 is provided as negative feedback to the switches 320, 334 of the DSA 300 and the reference switch 734 to control the DC bias to the gate terminal of the FET switches. The variation of the ON-resistance of the reference switch 734 due to temperature change, processing variations, aging, etc. will cause the negative feedback, which compensates the ON-resistance of the FET switches 320, 334.

If multi-gain-step passive DSA sections use the same FET switch type (same FET devices), the ON-resistance compensation loop can be centralized and shared. Multiple compensation loops may be used (at the expense of silicon area) if resistors of different material are used. One (central) compensation/control loop may be used for each resistor and switch type combination.

Figure 8:
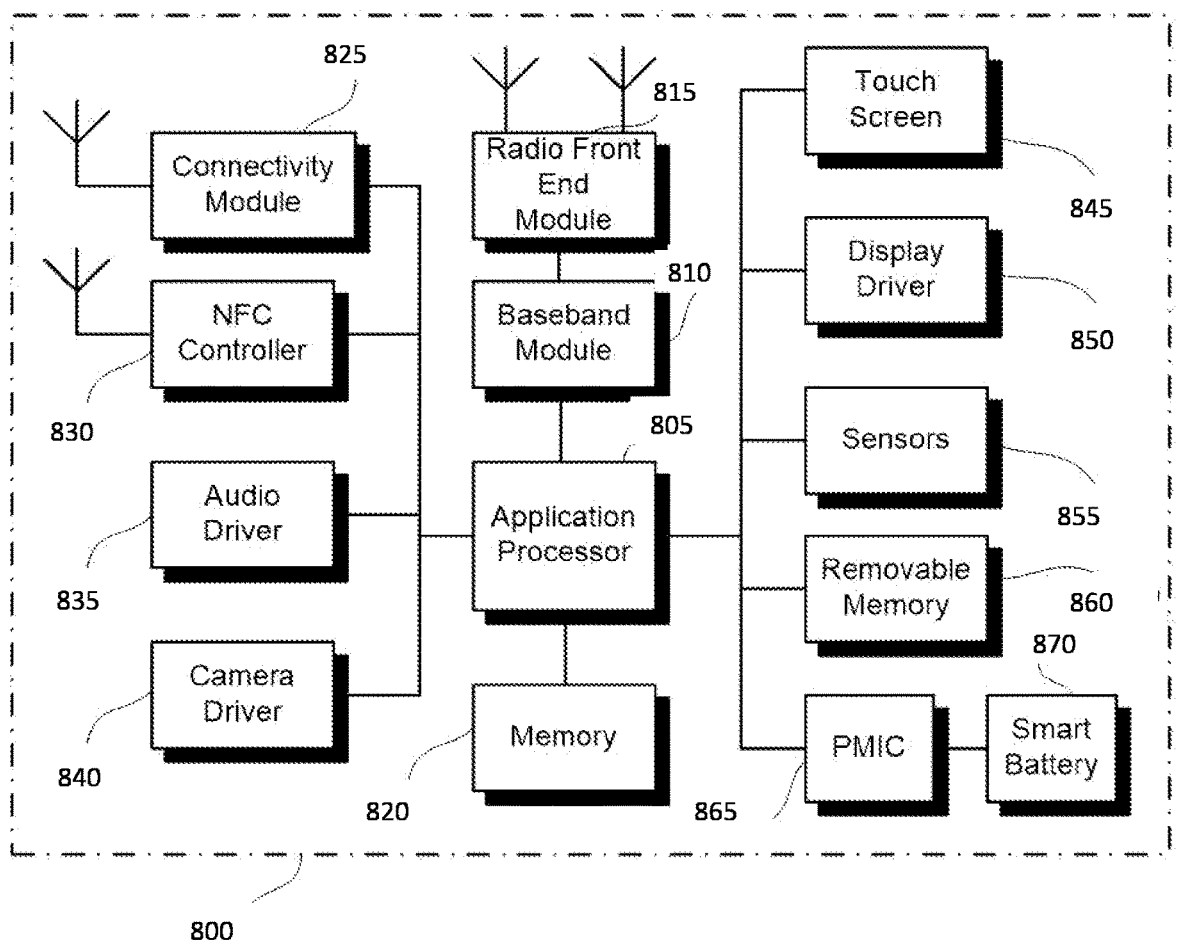
FIG. 8 illustrates a user device in which the examples disclosed herein may be implemented.

FIG. 8 illustrates a user device 800 in which the examples disclosed herein may be implemented. For example, the examples disclosed herein may be implemented in the radio front-end module 815, in the baseband module 810, etc. The user device 800 may be a mobile device in some aspects and includes an application processor 805, baseband processor 810 (also referred to as a baseband module), radio front end module (RFEM) 815, memory 820, connectivity module

825, near field communication (NFC) controller 830, audio driver 835, camera driver 840, touch screen 845, display driver 850, sensors 855, removable memory 860, power management integrated circuit (PMIC) 865 and smart battery 870.

In some aspects, application processor 805 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 810 may be implemented, for example, as a solder-down substrate including one or more integrated circuits, a single packaged integrated circuit soldered to a main circuit board, and/or a multi-chip module containing two or more integrated circuits.

Figure 9:
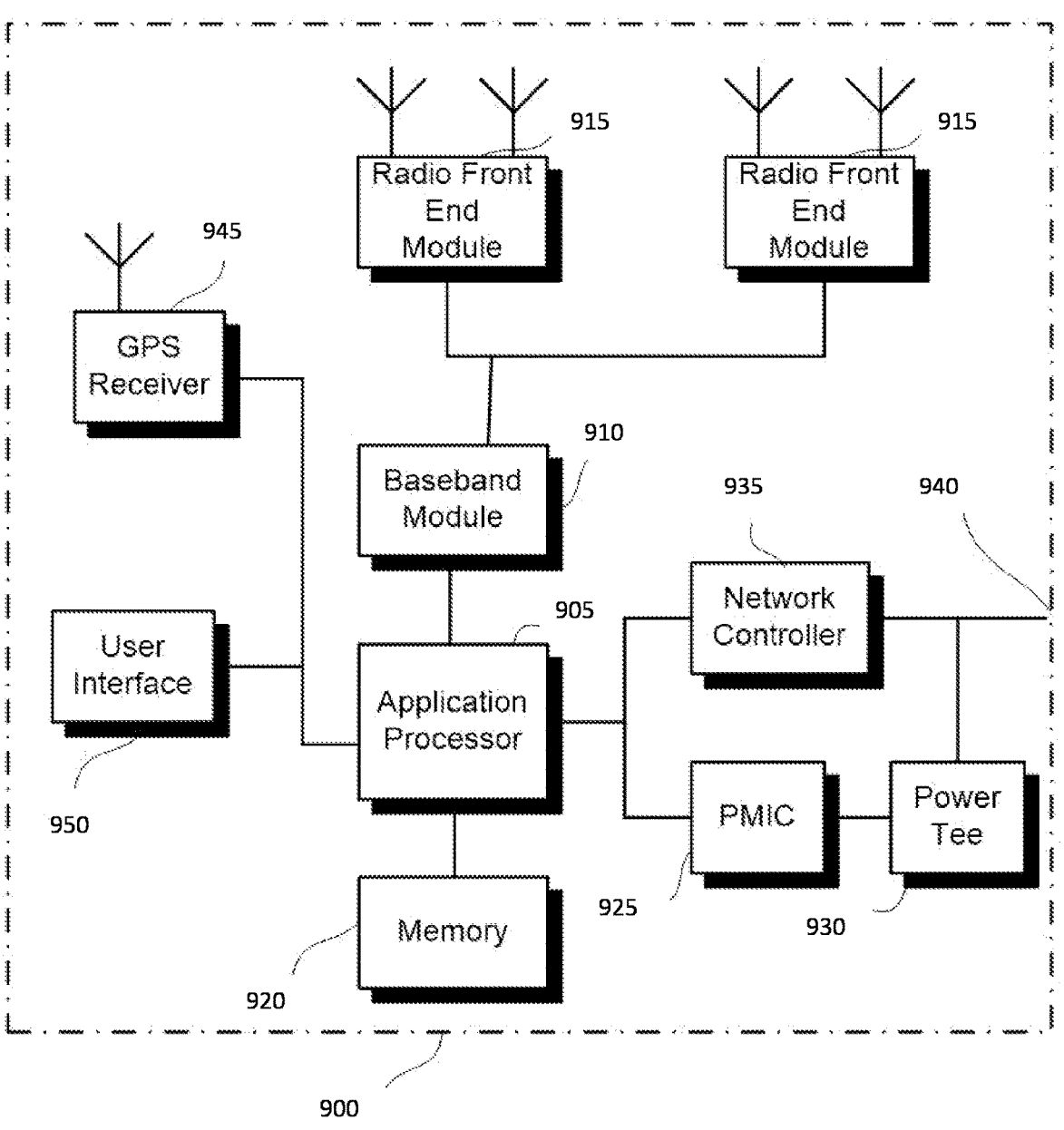
FIG. 9 illustrates a base station or infrastructure equipment radio head in which the examples disclosed herein may be implemented.

FIG. 9 illustrates a base station or infrastructure equipment radio head 900 in which the examples disclosed herein may be implemented. For example, the examples disclosed herein may be implemented in the radio front-end module 915, in the baseband module 910, etc. The base station radio head 900 may include one or more of application processor 905, baseband modules 910, one or more radio front end modules 915, memory 920, power management circuitry 925, power tee circuitry 930, network controller 935, network interface connector 940, satellite navigation receiver module 945, and user interface 950.

In some aspects, application processor 905 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose TO, memory card controllers such as SD/MMC or similar, USB interfaces, MIPI interfaces and Joint Test Access Group (JTAG) test access ports.

In some aspects, baseband processor 910 may be implemented, for example, as a solder-down substrate including one or more integrated circuits, a single packaged integrated circuit soldered to a main circuit board or a multi-chip module containing two or more integrated circuits.

In some aspects, memory 920 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 920 may be implemented as one or more of solder down packaged integrated circuits, socketed memory modules and plug-in memory cards.

In some aspects, power management integrated circuitry 925 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 930 may provide for electrical power drawn from a network cable to provide both power supply and data connectivity to the base station radio head 900 using a single cable.

In some aspects, network controller 935 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 945 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 945 may provide data to application processor 905 which may include one or more of position data or time data. Application processor 905 may use time data to synchronize operations with other radio base stations.

In some aspects, user interface 950 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

An example (e.g., example 1) relates to a DSA. The DSA includes a series path coupled between an input port and an output port, a plurality of series shunt switches coupled in parallel to the series path, and a plurality of parallel paths coupled to the series path in parallel. The series path includes a plurality of series resistors coupled in series. Each series shunt switch is for by-passing a different set of one or more series resistors. Each parallel path includes a parallel resistor and a parallel shunt switch, and each parallel path is coupled to either the input port, the output port, or an internal node between two adjacent series resistors, in parallel. A plurality of different π-attenuators with a different topology are formed by selectively controlling the series shunt switches and the parallel shunt switches.

Another example (e.g., example 2) relates to a previously described example (e.g., example 1), wherein at least two parallel paths are coupled to the input port and the output port, respectively, and at least one parallel path is coupled to each internal node between two adjacent series resistors.

Another example (e.g., example 3) relates to a previously described example (e.g., any one of examples 1-2), wherein multiple different single π-attenuators with a different attenuation factor are formed by selectively controlling the series shunt switches and the parallel shunt switches.

Another example (e.g., example 4) relates to a previously described example (e.g., any one of examples 1-3), wherein a cascaded π-attenuator cascading two π-attenuators is formed by selectively controlling the series shunt switches and the parallel shunt switches.

Another example (e.g., example 5) relates to a previously described example (e.g., any one of examples 1-4), wherein one series shunt switch is coupled between the input port and the output port to by-pass all the series resistors.

Another example (e.g., example 6) relates to a previously described example (e.g., any one of examples 1-5), wherein the series shunt switches and the parallel shunt switches are field effect transistor (FET) switches.

Another example (e.g., example 7) relates to a previously described example (e.g., example 6), further comprising an ON-resistance compensation loop configured to compensate a variation of an ON-resistance of the series shunt switches and the parallel shunt switches.

Another example (e.g., example 8) relates to a previously described example (e.g., example 7), wherein the ON-resistance compensation loop comprises first and second signal paths coupled in parallel, and an operational amplifier. The first signal path includes a reference resistor, and the second signal path includes a reference switch, and the first and second signal paths are coupled to a current source, and a voltage sensed from the first signal path is coupled to one input terminal of the operational amplifier and a voltage sensed from the second signal path is coupled to the other input terminal of the operational amplifier, and an output of the operational amplifier is sent as feedback to control the ON-resistance of the series shunt switches and the parallel shunt switches.

Another example (e.g., example 9) relates to a previously described example (e.g., example 8), wherein the reference resistor is a variable resistor.

Another example (e.g., example 10) relates to a previously described example (e.g., any one of examples 1-9), wherein the plurality of different π-attenuators with a different topology formed by selectively controlling the series shunt switches and the parallel shunt switches provides attenuation states in discrete or continuous levels.

Another example (e.g., example 11) relates to a previously described example (e.g., any one of examples 1-10), wherein the series path includes a first series resistor, a second series resistor, and a third series resistor coupled in series, wherein a first series shunt switch is coupled between the input port and the output port, and a second series shunt switch is coupled over the second series resistor for bypassing the second series resistor, wherein two parallel paths are coupled to the input port, two parallel paths are coupled to the output port, one parallel path is coupled to a first internal node between the first series resistor and the second series resistor, and one parallel path is coupled to a second internal node between the second series resistor and the third series resistor, wherein the series shunt switches and the parallel shunt switches are controlled to provide four different attenuation steps.

Another example (e.g., example 12) relates to a previously described example (e.g., example 11), wherein four additional parallel paths are coupled to the series path in parallel, wherein one additional parallel path is coupled to the input port, the first internal node, the second internal node, and the output port, respectively, wherein the four additional parallel paths are switched on and off to provide intermediate attenuation steps between the four different attenuation steps.

Another example (e.g., example 13) relates to a transceiver comprising the DSA as in any one of examples 1-12 configured to attenuate an input RF signal, an amplification stage coupled to an output of the DSA, the amplification stage being configured to amplify the input RF signal after attenuated by the DSA, and an ADC configured to convert the input RF signal amplified by the amplification state to a digital signal.

Another example (e.g., example 14) relates to a previously described example (e.g., example 13), comprising a cascaded digital step attenuator cascading at least two digital step attenuators of claim 1.

Another example (e.g., example 15) relates to a base station comprising the digital step attenuator as in any one of examples 1-12.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. A digital step attenuator, comprising:
a series path coupled between an input port and an output port, wherein the series path includes a plurality of series resistors coupled in series;
a plurality of series shunt switches coupled in parallel to the series path, wherein each series shunt switch is for by-passing a different set of one or more series resistors; and
a plurality of shunt paths, wherein each shunt path is coupled between a node in the series path and a reference potential and each shunt path includes a parallel shunt resistor and a parallel shunt switch, and each shunt path is coupled to either the input port, the output port, or an internal node between two adjacent series resistors, in parallel,
wherein a plurality of different π-attenuators with a different topology are formed by selectively controlling the series shunt switches and the parallel shunt switches,
wherein at least two shunt paths are coupled to the input port and the output port, and at least one shunt path is coupled to an internal node between two adjacent series resistors,
wherein the plurality of different π-attenuators with a different topology includes a cascaded π-attenuator cascading two π-attenuators formed by selectively controlling the series shunt switches and the parallel shunt switches.

2. The digital step attenuator of claim 1, wherein multiple different single x-attenuators with a different attenuation factor are formed by selectively controlling the series shunt switches and the parallel shunt switches.

3. The digital step attenuator of claim 1, wherein one series shunt switch is coupled between the input port and the output port to by-pass all the series resistors.

4. The digital step attenuator of claim 1, wherein the series shunt switches and the parallel shunt switches are field effect transistor (FET) switches.

5. The digital step attenuator of claim 4, further comprising an ON-resistance compensation loop configured to compensate a variation of an ON-resistance of the series shunt switches and the parallel shunt switches.

6. The digital step attenuator of claim 5, wherein the ON-resistance compensation loop comprises:
first and second signal paths coupled in parallel, wherein the first signal path includes a reference resistor, and the second signal path includes a reference switch, and the first and second signal paths are coupled to a current source;
an operational amplifier, a voltage sensed from the first signal path is coupled to one input terminal of the operational amplifier and a voltage sensed from the second signal path is coupled to the other input terminal of the operational amplifier, and an output of the operational amplifier is sent as feedback to control the ON-resistance of the series shunt switches and the parallel shunt switches.

7. The digital step attenuator of claim 6, wherein the reference resistor is a variable resistor.

8. The digital step attenuator of claim 1, wherein the plurality of different x-attenuators with a different topology formed by selectively controlling the series shunt switches and the parallel shunt switches provides attenuation states in discrete or continuous levels.

9. The digital step attenuator of claim 1, wherein the series path includes a first series resistor, a second series resistor, and a third series resistor coupled in series,
wherein a first series shunt switch is coupled between the input port and the output port, and a second series shunt switch is coupled over the second series resistor for by-passing the second series resistor,
wherein two parallel paths are coupled to the input port, two parallel paths are coupled to the output port, one parallel path is coupled to a first internal node between the first series resistor and the second series resistor, and one parallel path is coupled to a second internal node between the second series resistor and the third series resistor,
wherein the series shunt switches and the parallel shunt switches are controlled to provide four different attenuation steps.

10. The digital step attenuator of claim 9, wherein four additional parallel paths are coupled to the series path in parallel, wherein one additional parallel path is coupled to the input port, the first internal node, the second internal node, and the output port, respectively,
wherein the four additional parallel paths are switched on and off to provide intermediate attenuation steps between the four different attenuation steps.

11. A transceiver comprising:
the digital step attenuator (DSA) of claim 1 configured to attenuate an input radio frequency (RF) signal;

an amplification stage coupled to an output of the DSA, the amplification stage being configured to amplify the input RF signal after attenuated by the DSA; and an analog-to-digital converter (ADC) configured to convert the input RF signal amplified by the amplification state to a digital signal.

12. The transceiver of claim 11, comprising a cascaded digital step attenuator cascading at least two digital step attenuators of claim 1.

13. A base station comprising the digital step attenuator of claim 1.

\* \* \* \* \*